United States Patent
Kuo et al.

(10) Patent No.: US 7,501,837 B2
(45) Date of Patent: Mar. 10, 2009

(54) TEST STRUCTURE AND METHOD FOR DETECTING CHARGE EFFECTS DURING SEMICONDUCTOR PROCESSING USING A DELAYED INVERSION POINT TECHNIQUE

(75) Inventors: Ming-Chang Kuo, Changhua (TW); Ming-Hsiu Lee, Hsinchu (TW); Chao-I Wu, Tainan (TW)

(73) Assignee: Macronix International Co. Ltd. (TW)

( * ) Notice: Subject to any disclaimer, the term of this patent is extended or adjusted under 35 U.S.C. 154(b) by 151 days.

(21) Appl. No.: 11/279,224

(22) Filed: Apr. 10, 2006

(65) Prior Publication Data

US 2007/0236237 A1  Oct. 11, 2007

(51) Int. Cl.
*G01R 31/302* (2006.01)

(52) U.S. Cl. .................... 324/750; 324/158.1

(58) Field of Classification Search ........... None
See application file for complete search history.

(56) References Cited

U.S. PATENT DOCUMENTS

| | | | |
|---|---|---|---|
| 5,781,445 A | 7/1998 | Shiue et al. | |
| 5,861,634 A * | 1/1999 | Hsu et al. | 257/48 |
| 5,875,768 A * | 3/1999 | Schenk et al. | 123/688 |
| 6,016,062 A * | 1/2000 | Nicollian et al. | 324/769 |
| 6,028,324 A | 2/2000 | Su et al. | |
| 6,143,579 A | 11/2000 | Chang et al. | |
| 6,246,075 B1 | 6/2001 | Su et al. | |
| 6,461,918 B1 * | 10/2002 | Calafut | 438/270 |
| 6,534,825 B2 * | 3/2003 | Calafut | 257/335 |
| 7,235,389 B2 * | 6/2007 | Lim et al. | 435/174 |
| 2007/0212800 A1 * | 9/2007 | Wu et al. | 438/14 |

\* cited by examiner

*Primary Examiner*—Paresh Patel
(74) *Attorney, Agent, or Firm*—Baker & McKenzie LLP

(57) ABSTRACT

A semiconductor process test structure comprises a gate electrode, a charge-trapping layer, and a diffusion region. The test structure is a capacitor-like structure in which the charge-trapping layer will trap charges during various processing steps. A CV measurement can then be used to detect whether a Vfb shift has occurred. If the process step resulted in a charge effect, then the induced charge will not be uniform. If the charging of the test structure is not uniform, then there will not be a Vfb shift. A delayed inversion point technique can then be used to monitor the charging status.

14 Claims, 15 Drawing Sheets

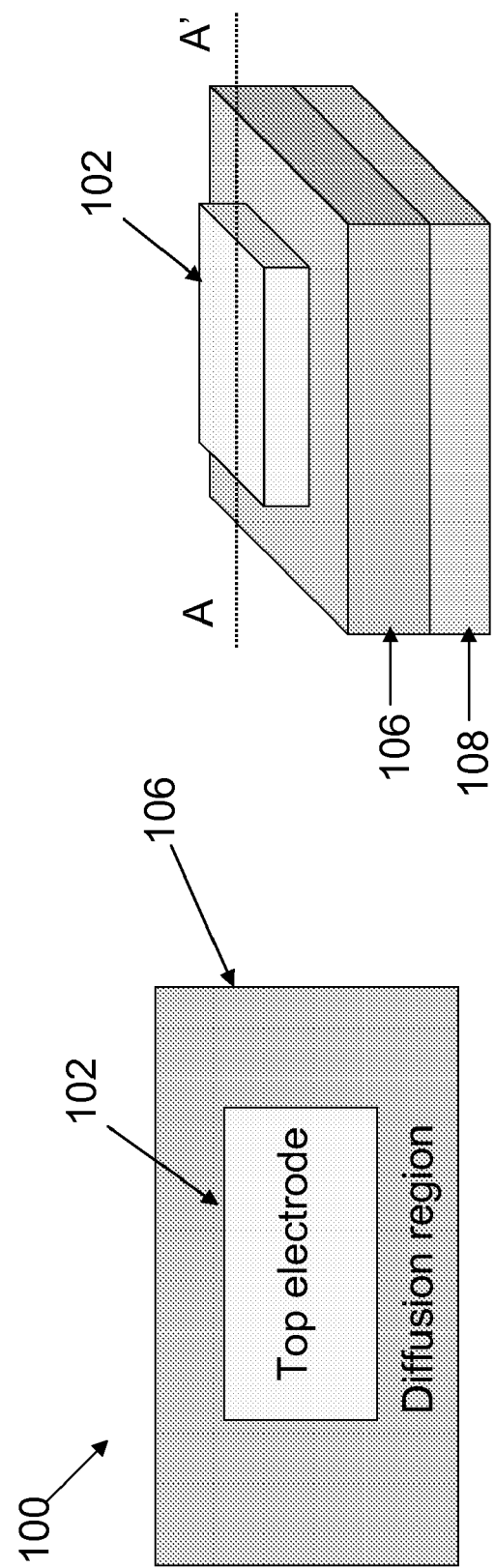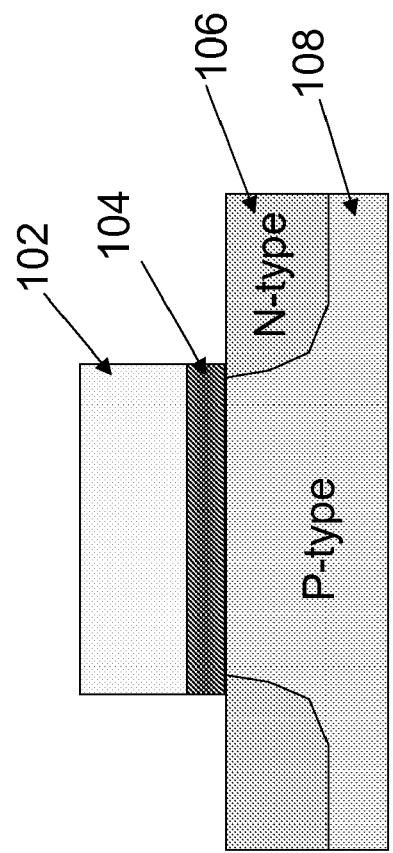
FIG. 1A
FIG. 1B
FIG. 1C

TEST STRUCTURE AND METHOD FOR DETECTING CHARGE EFFECTS DURING SEMICONDUCTOR PROCESSING USING A DELAYED INVERSION POINT TECHNIQUE

BACKGROUND

1. Field of the Invention

This invention relates generally to testing and diagnostics of line processes used for the manufacture of integrated circuit devices, and more particularly to the measurement and monitoring of the charging status in a gate dielectric layer of a test structure during semiconductor processing steps.

2. Background of the Invention

The manufacture of large-scale integrated circuits involves hundreds of discrete processing steps. These steps are typically divided into two sub-processes. The first of these sub-processes is often referred to as the front-end of line (FEOL) sub-process during which the semiconductor devices are formed within a silicon wafer. The second of the sub-processes is often termed the back-end of line (BEOL) sub-process during which various metal interconnecting layers and contacts are formed on top of the semiconductor devices formed during the FEOL sub-process.

Many of the processing steps comprising the FEOL and BEOL sub-processes involve depositing layers of material, patterning the layers by photolithographic techniques, and then etching away unwanted portions of the deposited material. The deposited materials primarily consist of insulators and metal alloys. In some instances the pattern layer serves as temporary protective mass, while on others they are functional components of the integrated circuit chips being formed.

Radio frequency (RF) plasmas are often used in many of the processing steps, especially in the processing steps comprising the BEOL sub-process. For example, RF plasmas are used in Reactive Ion Etching (RIE), which is used to etch the layers of material as described above. RIE provides the etching anisotropy required to achieve the requisite high degree of pattern definition and precision and the requisite precision dimensional control. In RIE, gaseous chemical etching is assisted by unidirectional ion bombardment provided by an RF plasma. Photo-resist layers, used in the photolithographic patterning described above, are also frequently removed using plasma ashing.

Unfortunately, the numerous exposures to the RF plasmas, and other forms of ionic radiation, results in radiation damage and the accumulation of charge on exposed conductive components, which leads to damaging current flows and trapped charges affecting the semiconductor devices and integrated circuit chips being formed. The surfaces of the patterned semiconductor wafer present multiple areas of conductors and insulators to the RF plasmas. The multiple areas of conductors and insulators produce local non-uniformities in the plasma currents, which can result in charge build up on the electrically floating conductor surfaces. This charge build up can produce the damaging current flows and can affect the threshold voltages for semiconductor structures formed on the silicon wafer.

The semiconductor devices often comprise some form of field effect transistor comprising a gate, drain, and source regions. The mechanism of current flow through the oxide layer forming the gate is primarily the result of Fowler-Nordheim (FN) tunneling. FN tunneling occurs at fields in excess of 10 MV/cm. Charge build up on the gate electrode resulting in a gate electro potential of only 10 volts is therefore sufficient to induce FN tunneling through an oxide layer of 100 Å. Such potentials are easily achieved in conventional plasma reactors used to generate RF plasmas and semiconductor processing. Excessive FN tunneling currents eventually lead to positively charged interface traps in the oxide layer forming the gate, which can lead to subsequent dielectric breakdown.

As the semiconductor wafer is exposed to successive processing steps, the damage or potential damage is increased. As a result, efforts are made to assess the damage produced in the various semiconductor processing steps. For example, one common way to test for the level of damage is to produce test wafers or test chips comprising structures designed to measure, or allow measurement of, the damage produced by various processing steps.

Test structures are typically formed within a specifically designated test site on a semiconductor wafer being processed. Alternatively, entire wafers can be devoted to providing a plurality of test structures for process monitoring. Thus, the test structures are run through the process which results in charge build up that can be then measured. A common method for measuring the charging status is to use Capacitance-Voltage (CV) techniques or floating gate testers. Such conventional techniques, however, are often unsatisfactory for the semiconductor industry because of their low sensitivity, high test chip cost, or long delay time associated with the production of data related to the testing.

For example, conventional CV method can only be used for processes with uniform charging effect. In other words, for processes that result in charge accumulating at the edge of the gate structure, conventional CV methods will suffer from insufficient capacitance change produced by the trapped charges. The insufficient capacitance change will render conventional CV methods insufficient for monitoring the charging status.

SUMMARY

A semiconductor process test structure comprises a gate electrode, a charge-trapping layer, and a diffusion region. The test structure is a capacitor-like structure in which the charge-trapping layer will trap charges during various processing steps. A CV measurement can then be used to detect whether a shift in the flatband voltage (Vfb) has occurred. If the process step resulted in a charge effect, then the induced charge will not be uniform. If the charging of the test structure is not uniform, then there will not be a Vfb shift. A delayed inversion point technique can then be used to monitor the charging status.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIGS. 1A-1C are diagrams illustrating various views of a test structure configured in accordance with one embodiment;

DETAILED DESCRIPTION OF THE PREFERRED EMBODIMENTS

Figure 2:
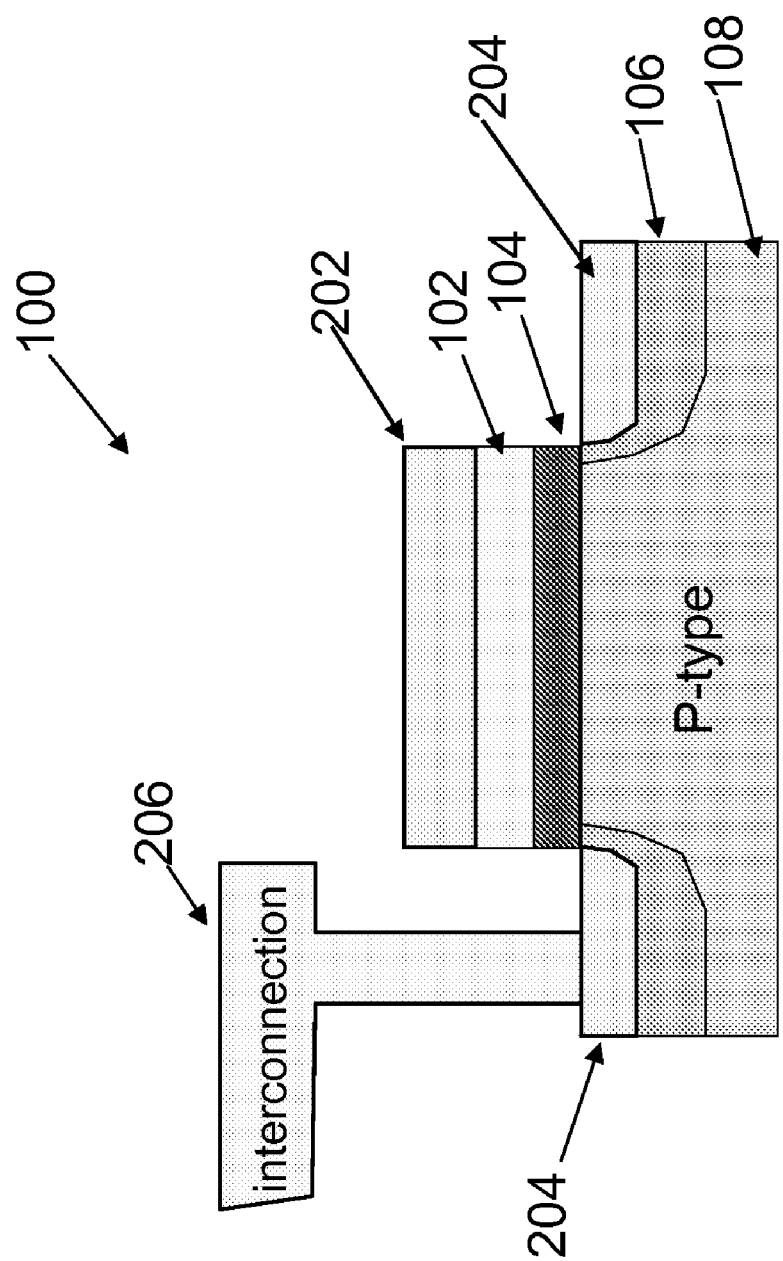
FIG. 2 is a diagram illustrating a metalized version of the test structure of FIG. 1 with test leads.

The systems and methods described herein are directed to simple capacitor-like test structures that can be used to reduce test wafer costs and shorten the delay time for producing test data that can be used to modify the semiconductor processes at issue in order to reduce damage resulting from charge accumulation during processing steps.

As described above, there are many semiconductor processing steps that can induce a charging effect onto the gate dielectric layer of a semiconductor structure, causing threshold voltage shifts and/or gate dielectric degradation. For memory devices including floating gate devices, such as EEPROMs and flash devices, and charge-trapping devices, such as SONOS devices, the charging effect will result in a wide initial threshold voltage distribution, which can impact the device's operation window. The charging effect can result from various electric fields, plasmas, or radiation, such as UV light, to which a semiconductor wafer is exposed during semiconductor processing.

FIGS. 1A-1C are diagrams illustrating various views of an example semiconductor test structure 100 configured in accordance with one embodiment of the systems and methods described herein. FIG. 1A is a diagram illustrating a top view of test structure 100. As can be seen, test structure 100 comprises a gate electrode 102 and a diffusion region 106. FIG. 1B is a perspective view of test structure 100 illustrating that diffusion region 106 sits atop a substrate 108. For example, substrate 108 can be a bulk Si substrate. FIG. 1C is a diagram illustrating a cross section of test structure 100 along line A-A'. In the cross-sectional view of FIG. 1C, charge-trapping layer 104 can be seen. Charge-trapping layer can reside under electrode 102 and over diffusion region 106.

Charge-trapping layer 104 is a dielectric layer designed to trap charges within structure 100. In one embodiment, charge-trapping layer 104 comprises an oxide-nitride-oxide structure. In another embodiment, charge-trapping layer 104 comprises an oxide-Si-oxide structure, such as a SiO2-Si—SiO2 structure. It will be apparent, however, that any dielectric layer or structure that can be used to trap charge in accordance with the systems and methods described below can be used for charge-trapping layer 104.

Gate electrode 102 can comprise a polysilicon layer depending on the embodiment. In one embodiment, substrate 108 is a P-type substrate, while diffusion region 106 comprises an N-type region. In other embodiments, substrate 108 can be a N-type substrate, while diffusion region 106 is a P-type region.

As illustrated in FIG. 2, diffusion region 106 and gate electrode 102 can be metallized with metal layers 202 and 204 respectively. For example, in one embodiment, metal layers 202 and 204 can be metal silicide layers. Metallizing diffusion region 106 and gate electrode 102 can reduce the resistance associated with diffusion region 106 and gate electrode 102.

Testing of structure 100 can be accomplished by directly probing on diffusion region 106 and gate electrode 102. Alternatively, interconnection leads, such as interconnection lead 206, can be connected with metal layers 202 and/or 204. These interconnection leads can then be probed in order test the charging status of structure 100.

Thus, test structure 100 can be subjected to the process steps being monitored. This will result in charge being imparted to charge-trapping layer 104 during the various process steps. The charge can be imparted, as explained above, by an electric field, plasma, charge particles, radiation (UV) or other sources. The amount of charge or charge status in charge-trapping layer 104 can then be monitored by probing gate electrode 102 and diffusion region 106 or interconnection leads attached thereto.

It should be noted that diffusion region 106 can be formed before or after the process steps being tested are performed depending on the embodiment.

Figure 3:
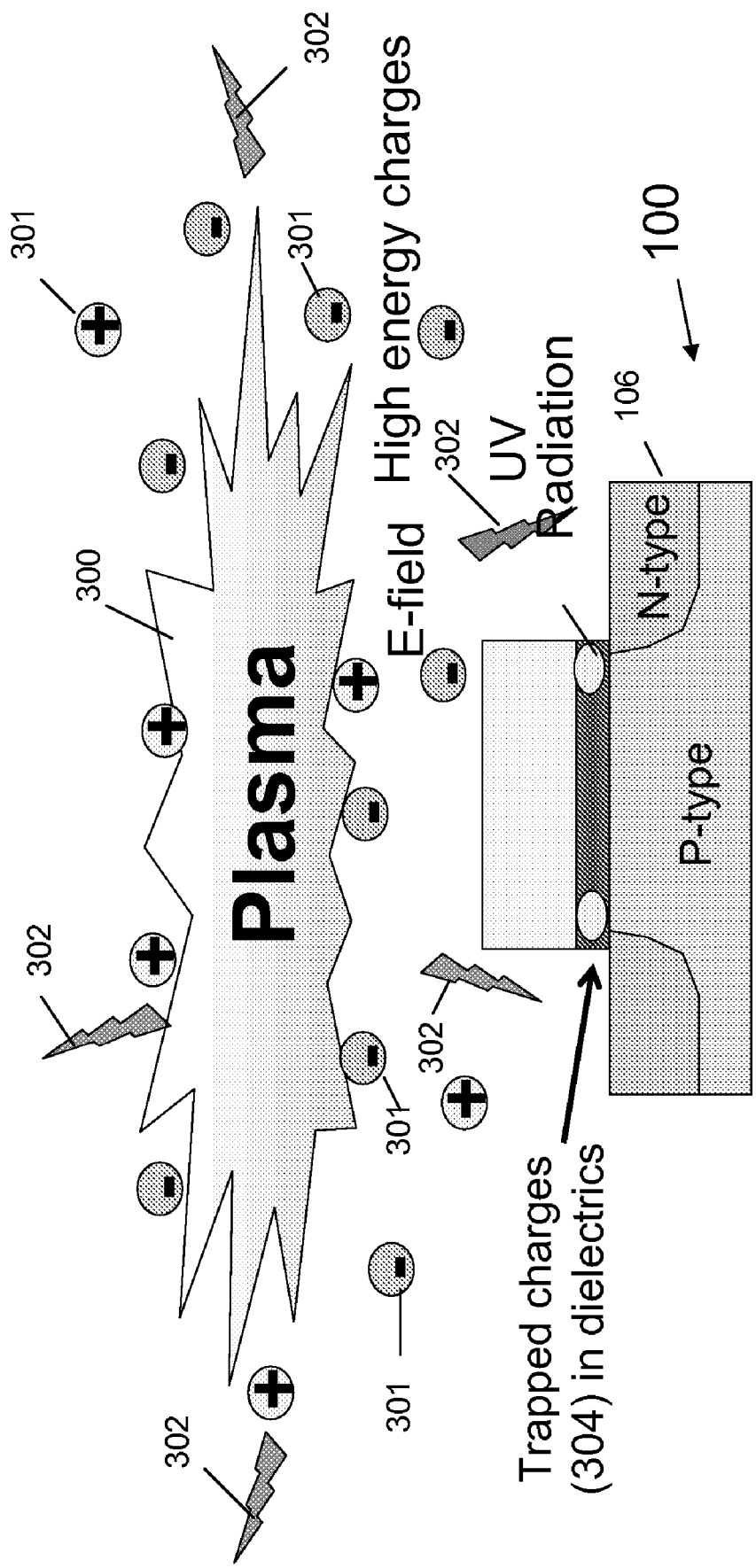
FIG. 3 is a diagram illustrating charging effect for the test pattern of FIGS. 1A-1C during a process step.

FIG. 3 is a diagram illustrating how various processing steps can result in trapped charges 304 residing in trapping layer 104 of test structure 100. For example, charge 304 can be trapped as a result of high-energy charges 301 produced by a plasma 300, a large e-field produced by a processing step, or UV radiation 302. By subjecting test structure 100 to the processing step and exposing it to one of these sources, the charging of test structure 100 can be monitored to determine if the charging of test structure 100 is uniform or non-uniform, e.g., the process results in an edge charging effect for test structure 100.

Figure 4:
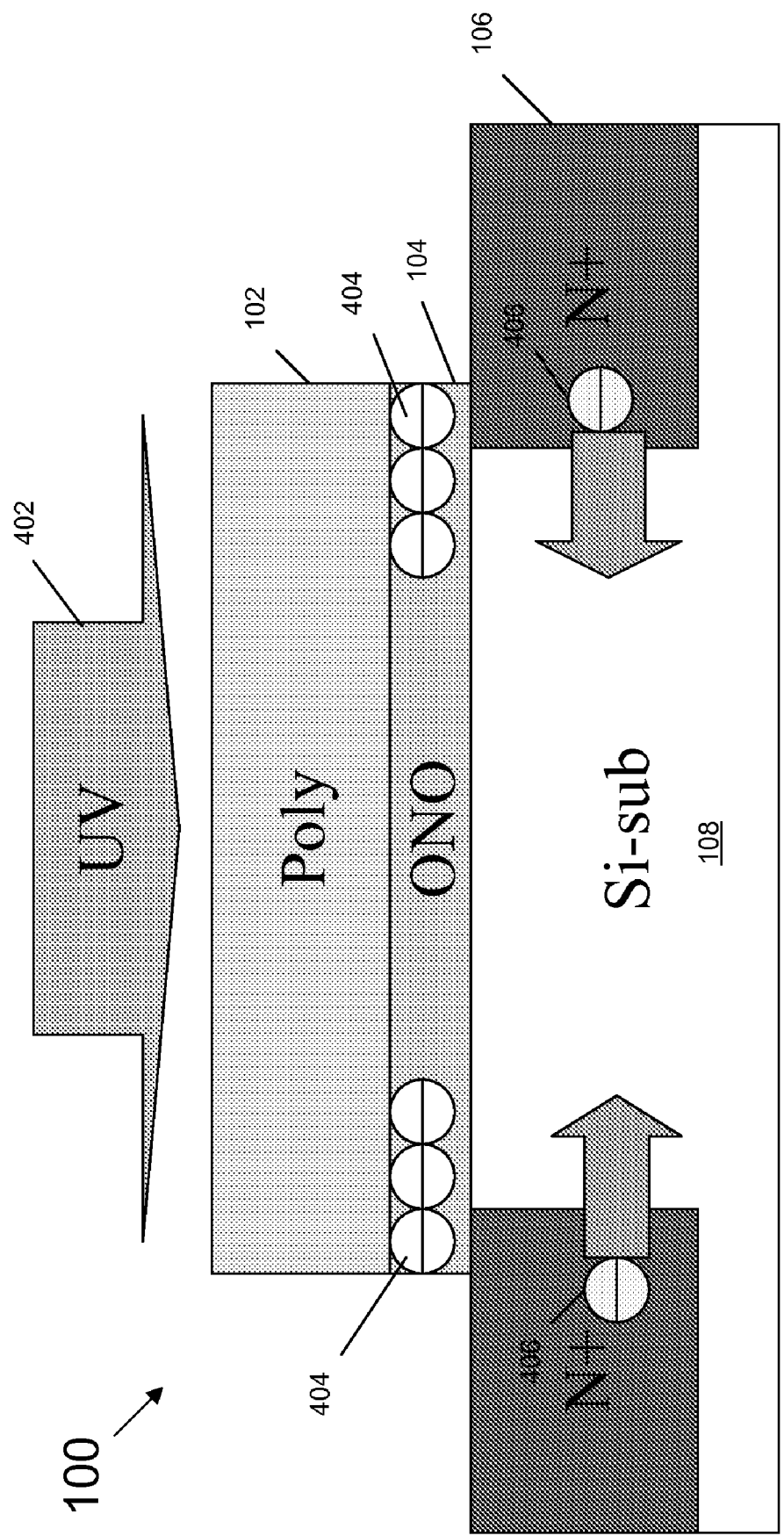
FIG. 4 is a diagram illustrating a CV measurement for the test pattern of FIGS. 1A-1C after the process step of FIG. 3.
Figure 5B:
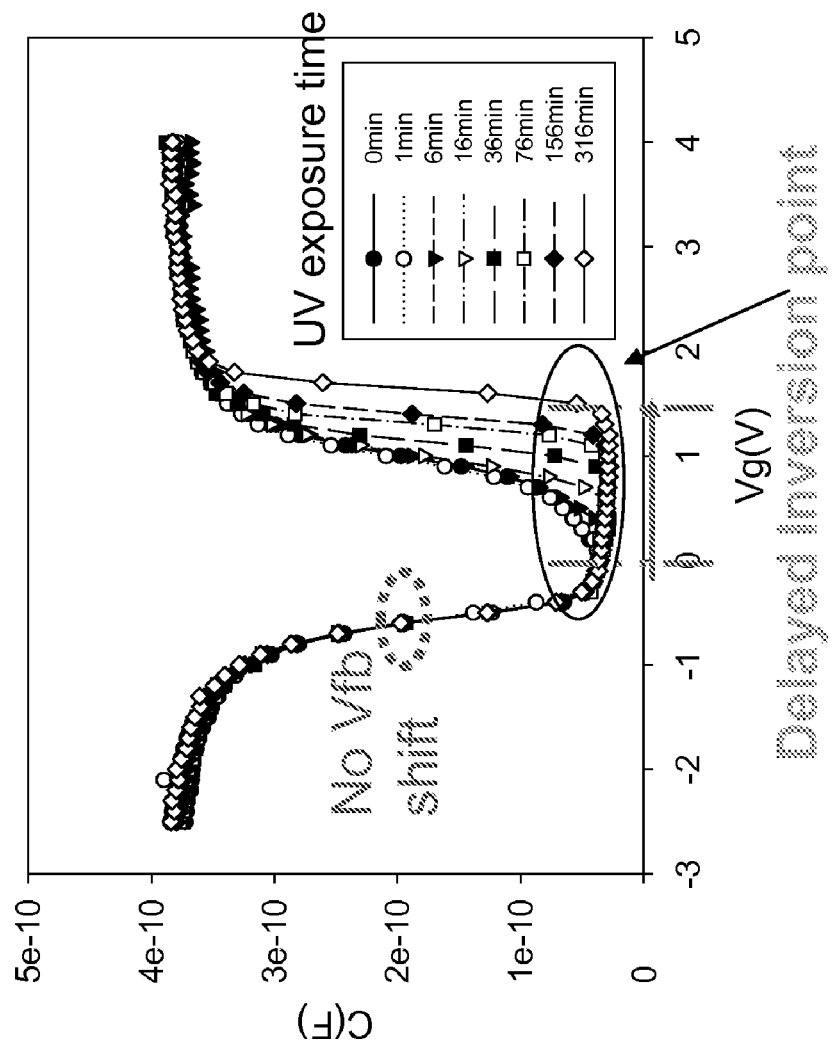
FIG. 5B is graph illustrating resulting CV measurements for the test pattern of FIGS. 1A-1C, when it experiences the edge charging effect of FIG. 5A.
Figure 5A:
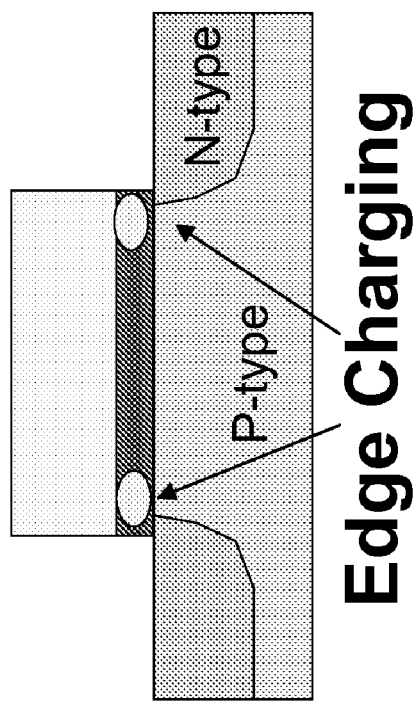
FIG. 5A is a diagram illustrated an edge charging effect of the test pattern of FIGS. 1A-1C.

This can be illustrated in conjunction with FIGS. 4, 5A, and 5B. FIG. 4 illustrates that when test structure 100 is subjected to UV radiation 402, charge 404 will be induced into layer 104 of test pattern 100. A CV measurement for test structure 100, e.g., as illustrated in FIG. 5B, can then be performed. The graph of FIG. 5B illustrates that as the voltage applied to gate electrode 102 of test structure 100 is increased, the test structure will go through an accumulation, depletion, and then inversion stages. The point separating accumulation from inversion is referred to as the flatband voltage (Vfb). Inversion occurs once the gate voltage exceeds the threshold voltage (Vt).

When charge 404 is trapped in trapping layer 104, however, charge 404 will block charge 406 flowing between diffusion region 106 so that the curve of FIG. 5B can only be measured at higher gate voltages. In other words, the curve illustrated in 5B shifts to the right when induced charge 404 is trapped in trapping layer 104.

This shift to the right of the curve in FIG. 5B can be referred to as a Vfb shift. This shift will only occur, however, if UV radiation 402 caused uniform injection of charge 404 into trapping layer 104. If, on the other hand, the induced charge is not uniform, then the delayed inversion point scenario illustrated in FIG. 5B will exist. The delayed inversion point refers to the bottom side of the curve in FIG. 5B. The curve in FIG. 5B actually represents a plurality of curves, each different curve representing the CV measurement for test structure 100 after an increasing amount of stress, or UV exposure time.

For example, in the case where test structure 100 has experienced an edge charging effect as in FIG. 5A, then the induced charge will not be uniform and the right hand side of the curve in FIG. 5B will push out gradually with increased UV exposure. This delayed inversion point can then be monitored in order to determine the charging status of test structure 100. The monitored charged status can then be used to modify the process step being tested.

Figure 6:
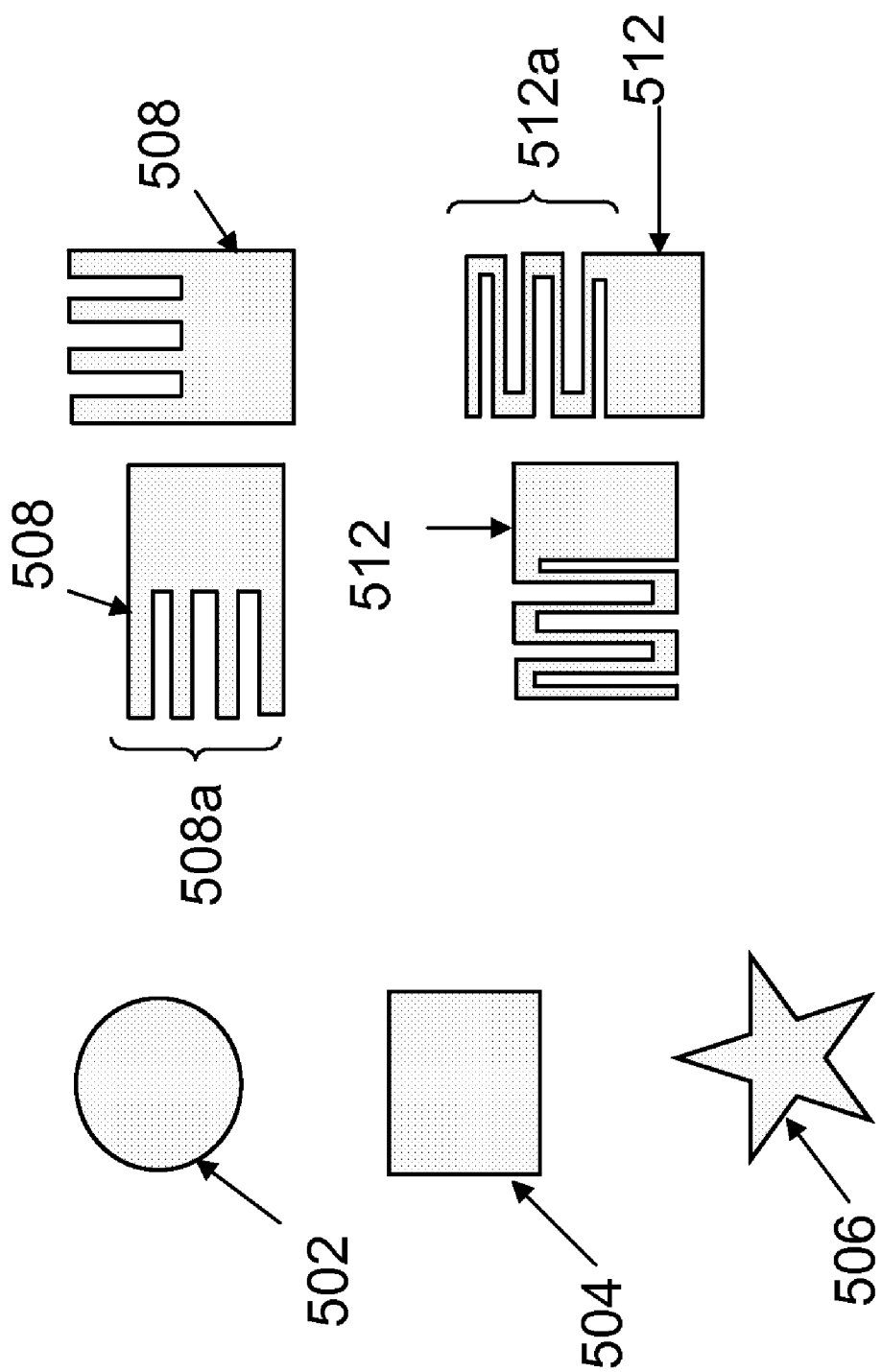
FIG. 6 is a diagram illustrating a plurality of different gate electrode shapes that can be used for the test structure of FIG. 1.

As illustrated in FIGS. 6-11, test structures comprising different test patterns can be designed for different process-monitoring purposes. For example, FIG. 6 illustrates several example shapes that can be used for gate electrode 102 depending on the embodiment. Thus, depending on the embodiment, test structure 100 can comprise a circular gate electrode 502, a square gate electrode 504, a star-shaped gate electrode 506, etc. A more complex shape can be used for gate electrode 102 depending on the process being monitored. For example, a gate electrode 508 with a plurality of fingers 508a can be used in certain embodiments of test structure 100. Other embodiments of test structure 100 can use a gate electrode 512 that includes a plurality of long lines 512a.

Gate electrodes can be configured with a different axis of orientation as well. For example, gate electrode 508 can be oriented along a horizontal axis of orientation or a vertical axis of orientation as illustrated in FIG. 6. Similarly, gate electrode 512 can be oriented along a horizontal axis or a vertical axis as required by a specific embodiment.

As would be understood, the charging effect that occurs during the various processing steps is a result of various conductive layers and areas acting like an antenna that attract charge produced during the various processing steps. Configuring gate electrodes with, e.g., long fingers 508a or long lines 512a can increase or decrease this antenna effect, which can be used to produce more relevant or accurate test data.

Figure 7:
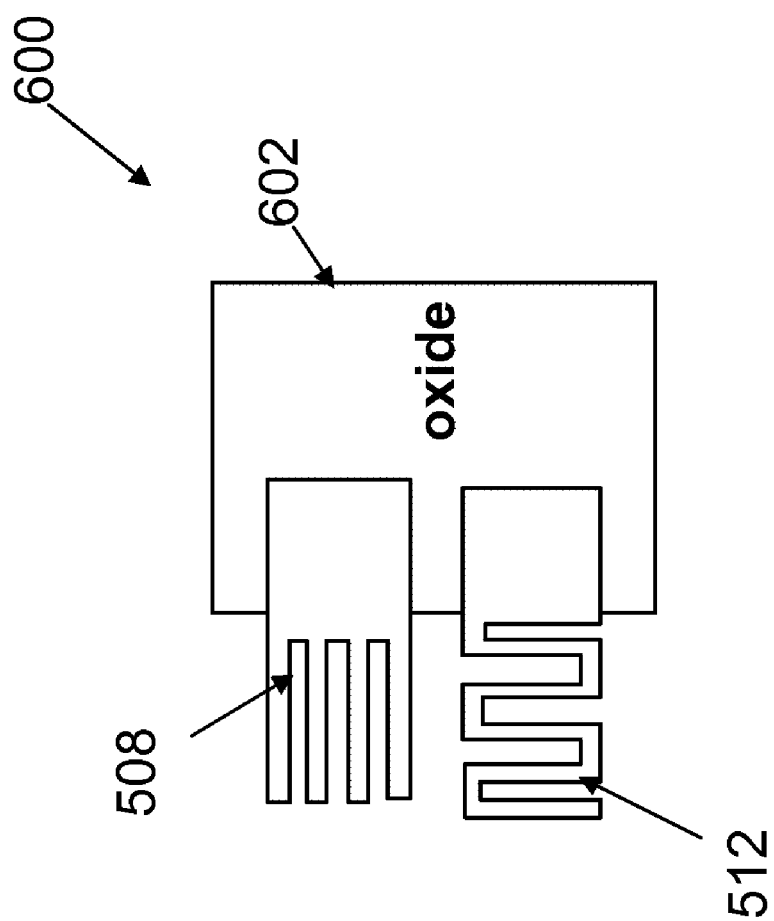
FIG. 7 is a diagram illustrating another example test structure in accordance with another embodiment.

In other embodiments, gate electrodes configured in various shapes can be combined with oxide regions in a manner configured to achieve the desired testing for different processes and monitoring purposes. For example, FIG. 7 is a diagram illustrating a gate electrode 508 and a gate electrode 512 combined with a partial oxide region 602 to form a test structure 600. Test structure 600 can, for example, be used to test for the antenna effect referred to above. In other embodiments, partial oxide region 602 can be combined with a gate electrode 508 alone or a gate electrode 512 alone. Further, in other embodiments, other gate electrodes of various shapes and orientations can be combined with oxide region 602.

Figure 8:
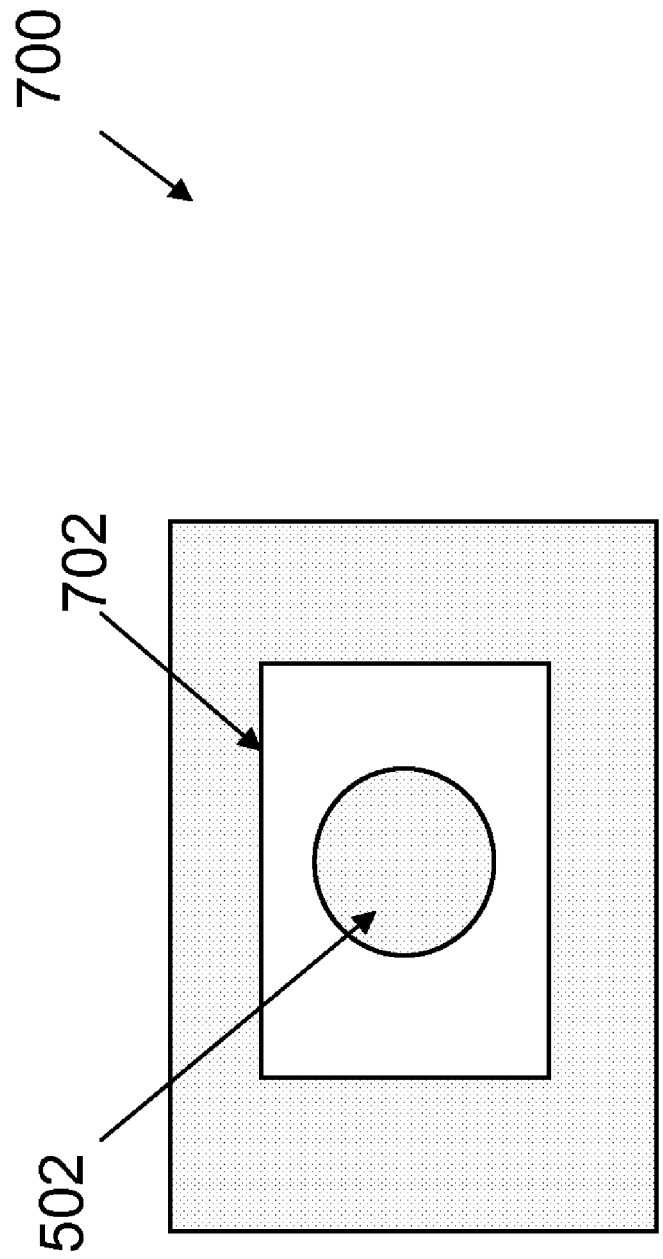
FIG. 8 is a diagram illustrating another example test structure in accordance with another embodiment.

FIG. 8 is a diagram illustrating a test structure 700 comprising a circular gate electrode 502 surrounded by an oxide region 702. Test structure 700 can be used to isolate a leakage path within test structure 700. Again, it will be clear that other gate electrodes comprising other shapes and/or orientations can be combined with oxide region 702 depending on the embodiment.

Figure 9:
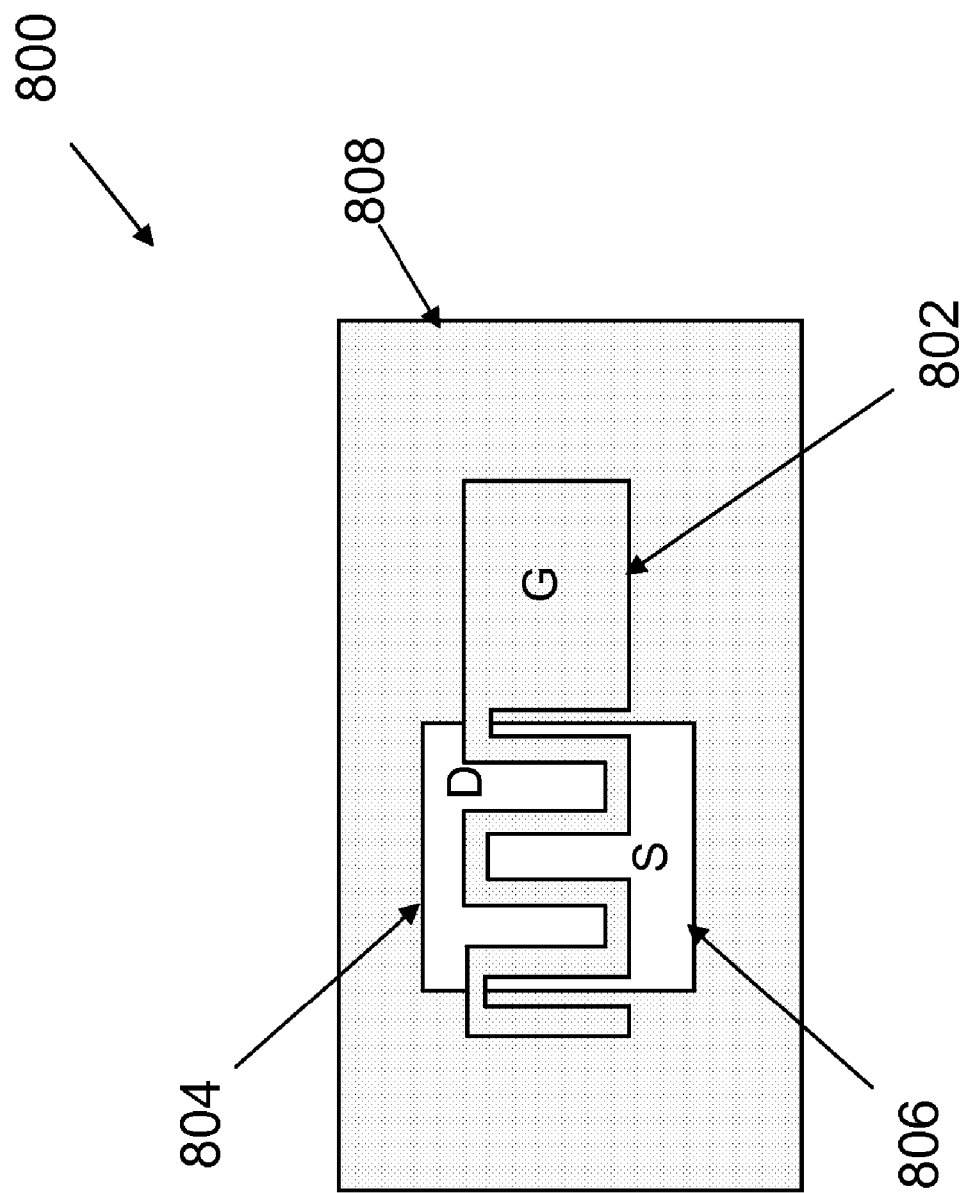
FIG. 9 is a diagram illustrating another example test structure comprising a plurality of diffusion areas in accordance with another embodiment.
Figure 10:
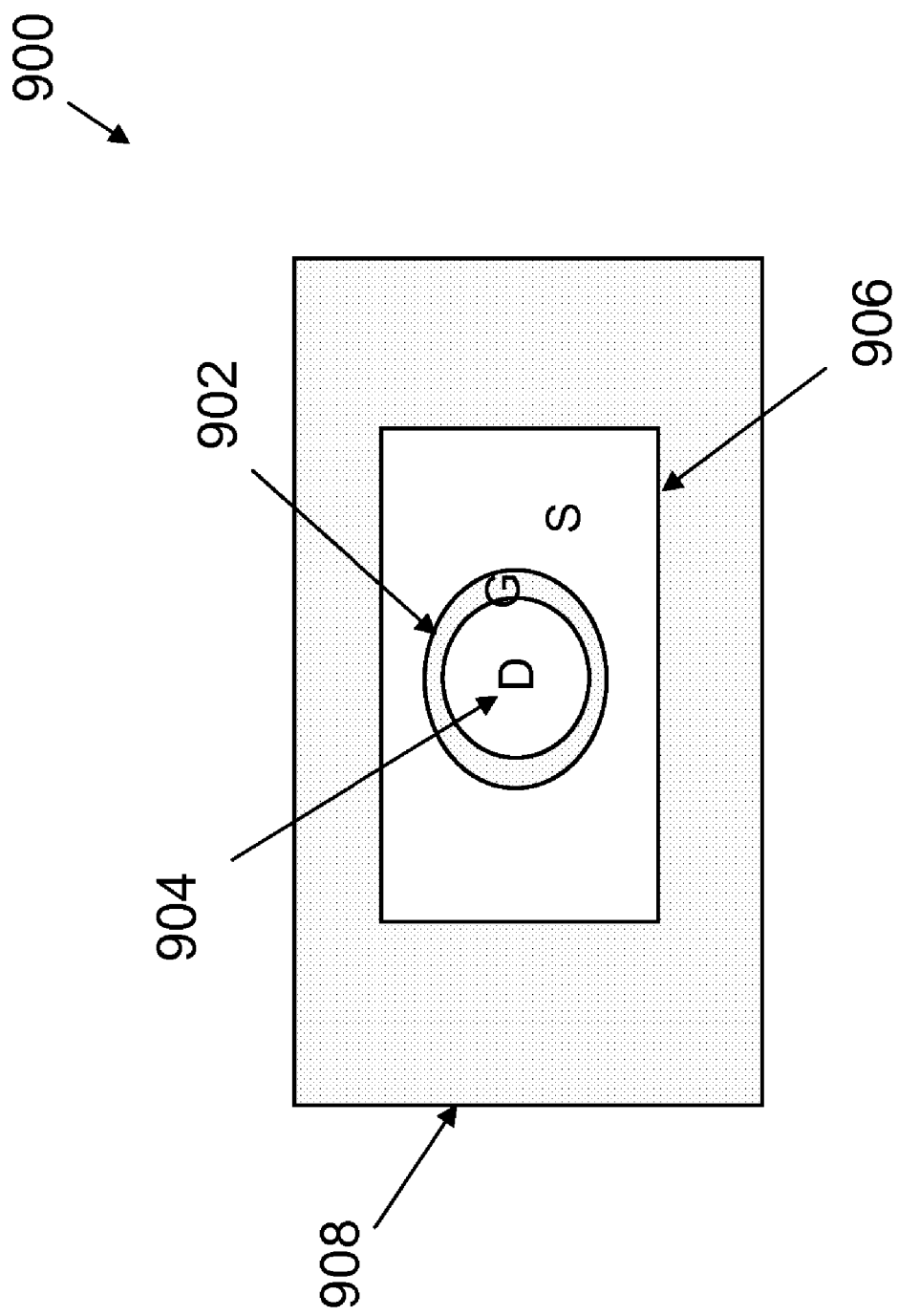
FIG. 10 is a diagram illustrating another example test structure comprising a plurality of diffusion areas in accordance with another embodiment.

In other embodiments, the diffusion region can be separated into two or more regions, e.g., by the gate electrode structure. For example, the diffusion region can be separated into source and drain regions as would be found in a MOSFET structure. FIG. 9 is a diagram illustrating an example test structure 800 comprising a gate electrode 802 separating a drain region 804 and source region 806. Drain and source region can be formed in substrate 808. FIG. 10 is a diagram illustrating another test structure 900 comprising a drain region 904 and source region 906 separated by a gate electrode 902.

Figure 11:
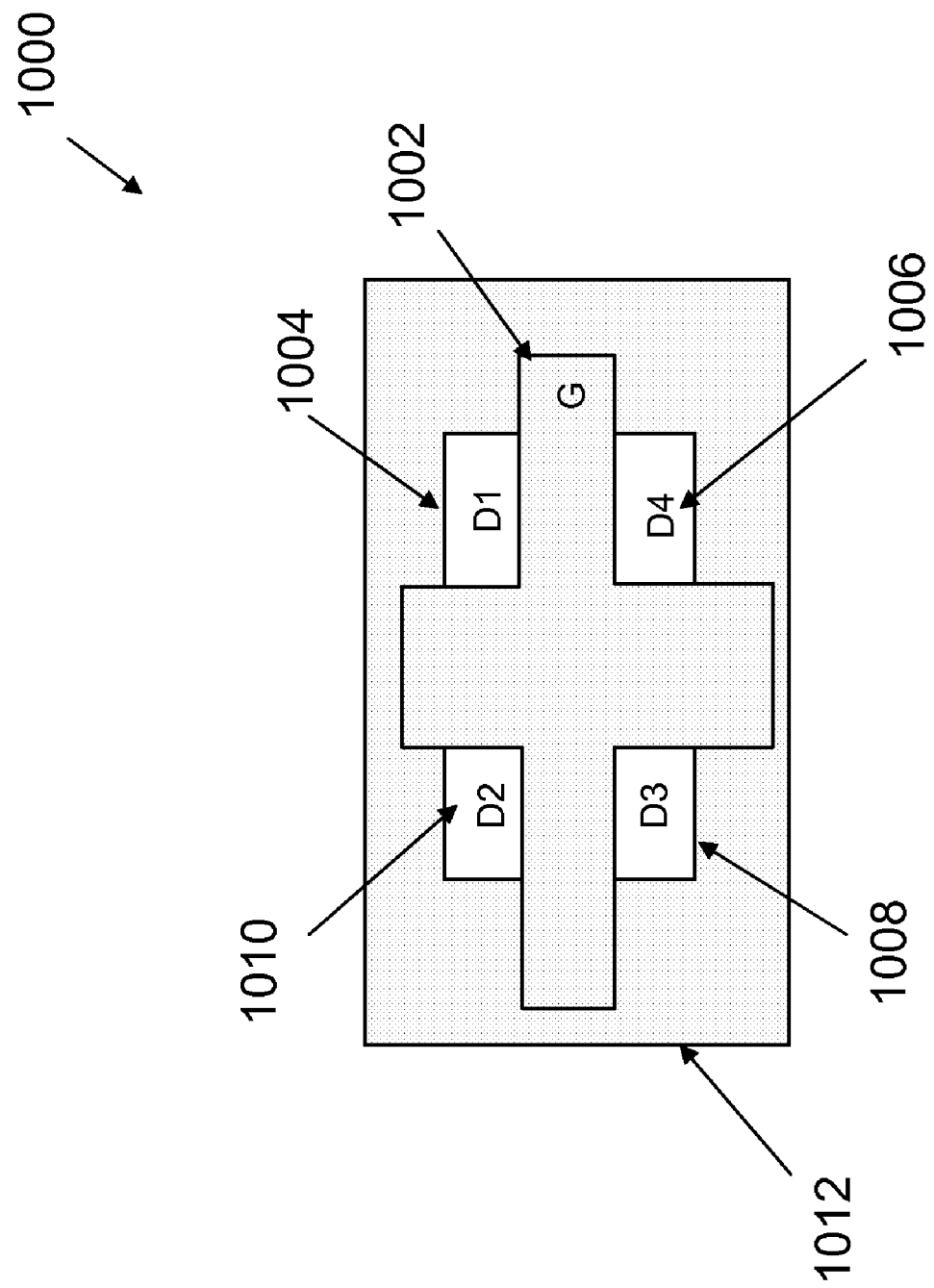
FIG. 11 is a diagram illustrating another example test structure comprising a plurality of diffusion areas in accordance with another embodiment.

It will be clear that a plurality of diffusion regions can also be included in a test structure configured as described herein. For example, FIG. 11 is a diagram illustrating a test structure 1000 comprising four diffusion regions, 1004, 1006, 1008, and 1010, separated by gate electrode 1002. In general any number of diffusion regions required to achieve the test data being sought can be included within the test structure configured in accordance with the systems and methods described herein. Further, the shape of the gate electrode can be varied as required to achieve the test data being sought and to separate the various diffusion regions.

Figure 12:
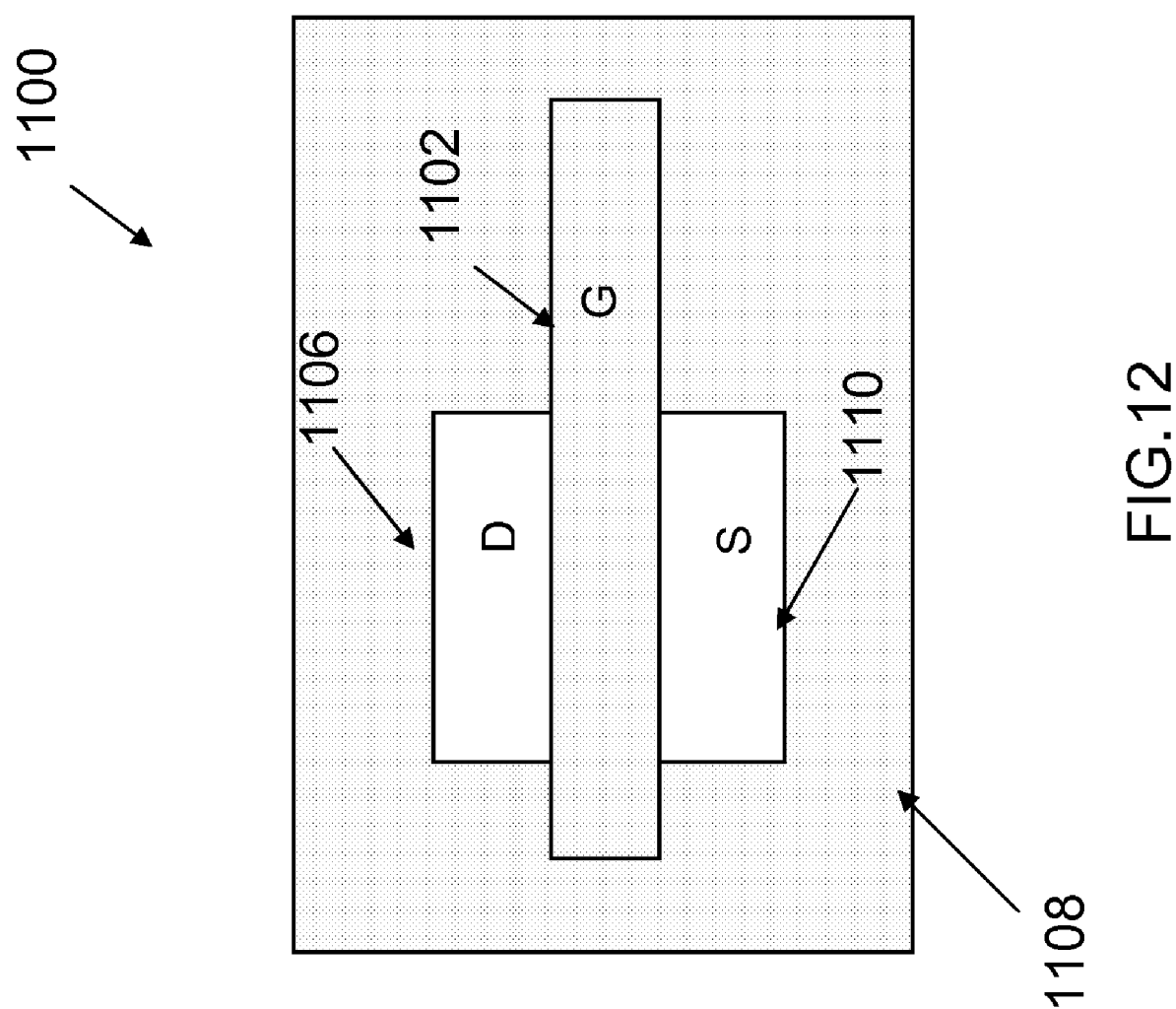
FIG. 12 is a diagram illustrating another example test structure comprising a plurality of diffusion areas in accordance with another embodiment.

When the diffusion region is separated into two or more regions, as with the embodiments of FIGS. 9-11, the charging effect can be measured for each diffusion region independently. This can be illustrated with the aid of the test structure illustrated in FIG. 12. FIG. 12 illustrates a test structure 1100 comprising a gate electrode 1102 separating a drain diffusion region 1106 and the source diffusion region 1110 formed on substrate 1108. The charge effect can be determined by applying certain bias voltages to gate electrode 1102, drain 1106, and source 1110 and then monitoring the delayed inversion point.

Figure 13:
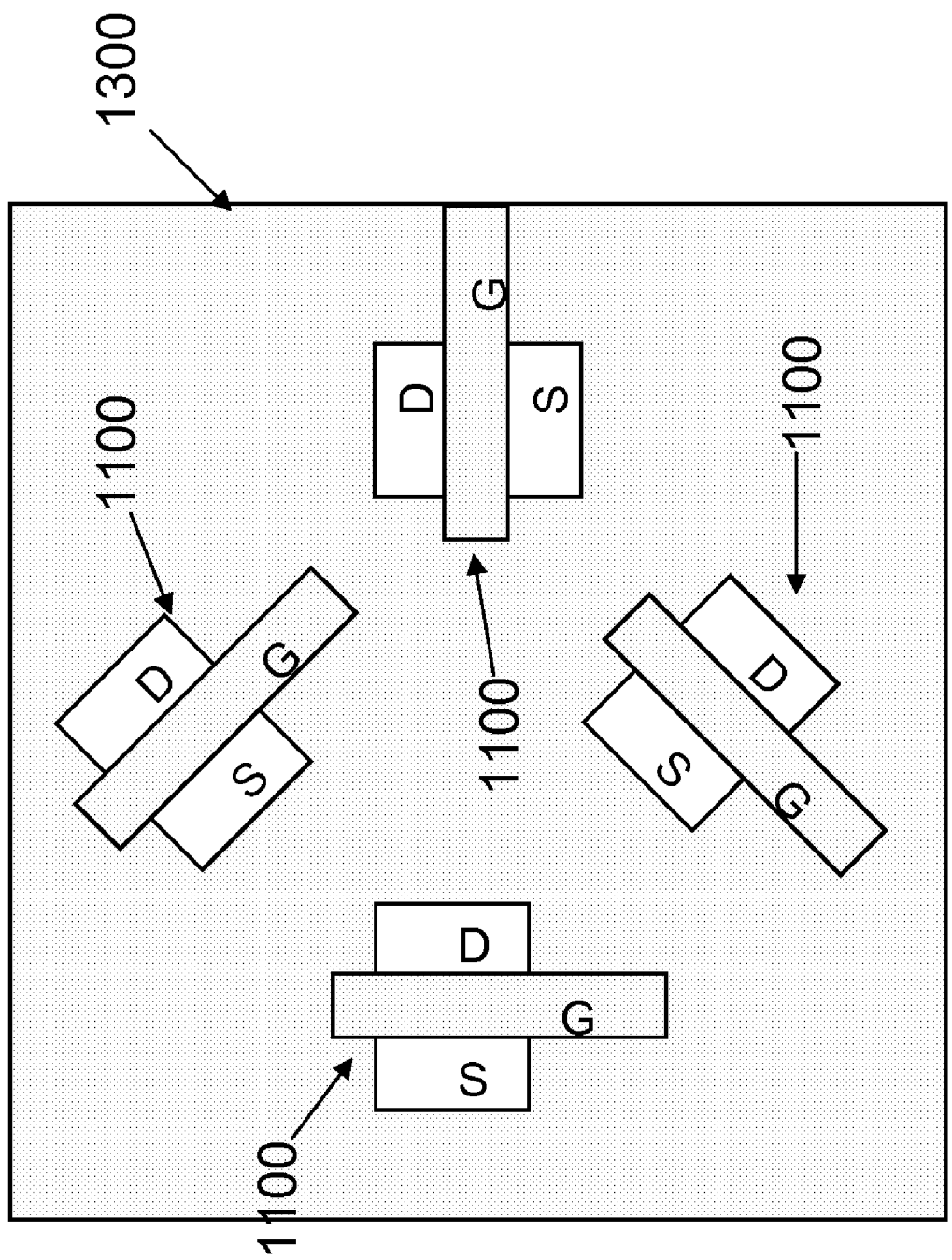
FIG. 13 is a diagram illustrating a pattern comprising a plurality if the test structures of FIG. 11.

Multiple test structures can be laid out with different orientations, e.g., in order to provide information related to an isotropic charging effect. In FIG. 13, for example, a plurality of test structures 1100 are laid out in a pattern 1300. As can be seen, test structure 1100 and pattern 1300 can have vertical, horizontal, or diagonal orientations. A pattern of test structures, such as pattern 1300 with varying orientations can be useful in providing an isotropic charging effect information. It will be apparent that other test structure patterns can comprise more or less test structures along with more or less orientations. Further, a test pattern can comprise test structures with different shapes and dimensions as well as different orientations.

Figure 14:
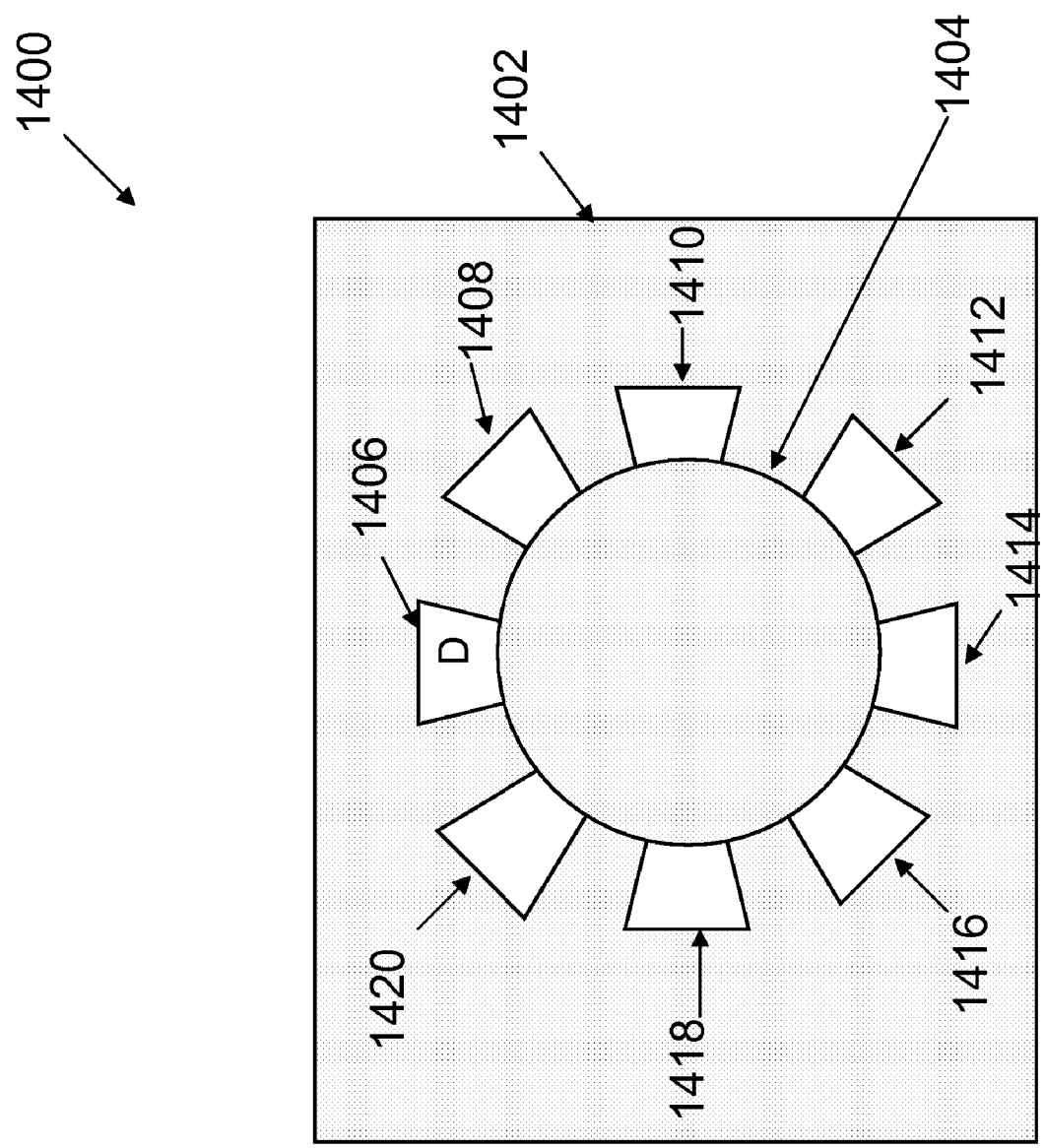
FIG. 14 is a diagram illustrating another example test structure comprising a plurality of diffusion areas in accordance with another embodiment.
Figure 15:
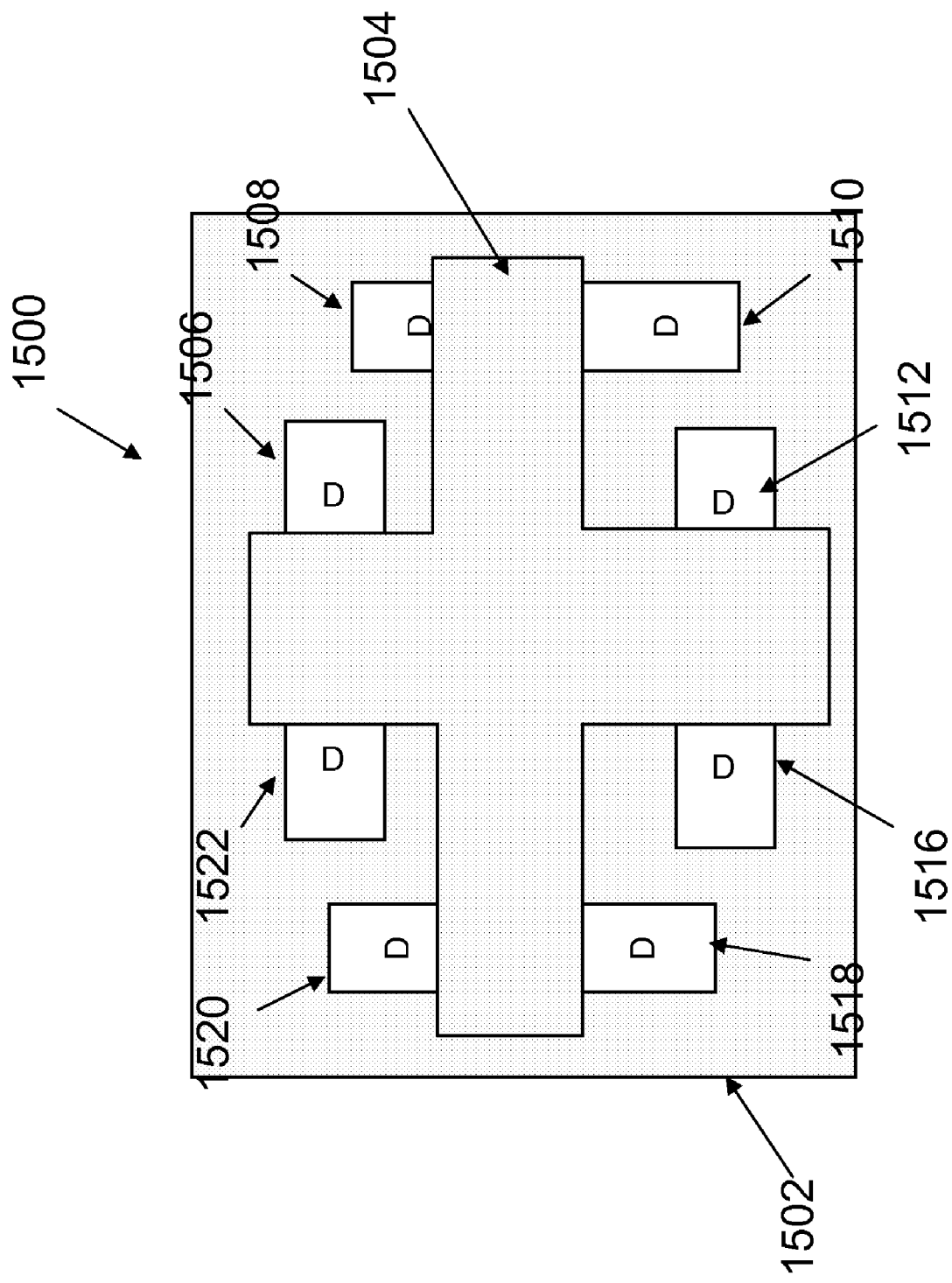
FIG. 15 is a diagram illustrating another example test structure comprising a plurality of diffusion areas in accordance with another embodiment.

As mentioned above, the size, shape, and orientation of a test structure, gate electrode, and/or diffusion regions can be varied to achieve the desired test data. FIGS. 14 and 15 illustrate two example embodiments of test structures 1400 and 1500 respectively that are slightly more complex than the previous structures illustrated above. It will be clear, however, that the embodiments described herein are by way of example only and that the particular test structures described should not be seen as limiting the systems and methods described herein to any particular test structures, shapes, orientations, or levels of complexity.

FIG. 15 is a diagram illustrating a test structure 1500 in accordance with one embodiment of the systems and methods described herein. Test structure 15 comprises a gate electrode 1504 separating a plurality of diffusion regions 1506-1522, formed on a substrate 1502. FIG. 14 is a diagram illustrating a test structure 1400 configured in accordance with another embodiment of the systems and methods described herein. Test structure 14 comprises a circular gate electrode 1404 separating diffusion regions 1406-1420 formed on substrate 1402.

A plurality of test structures, such as those described above, can be arranged on a single wafer, either in the scribe line or in the chip area, for process monitoring. As mentioned, multiple test structures can be arranged comprising different shapes and orientations. Further, one or more of the test structures can be packaged into a discreet device as a sensing element for plasma or radiation detecting.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for monitoring a charge status for a test structure formed on a silicon substrate that results from a semiconductor processing step, the method comprising:

performing a first CV measurement on the test structure to generate a first CV curve;

subjecting the test structure to the semiconductor processing step;

performing a second CV measurement on the test structure to generate a second CV curve;

detecting whether there is a shift between the first and the second CV curves; and when there is not a shift, monitoring the charge status for the test structure based at least in part on delayed inversion point information.

2. The method of claim 1, further comprising determining that the charge status for the test structure is uniform when there is a shift in the first and the second CV curves.

3. The method of claim 1, further comprising detecting an edge charge effect based on a shift detected in the delayed inversion point information.

4. The method of claim 1, wherein the test structure comprises a gate electrode and a diffusion region, the method further comprising placing probes directly on the gate electrode and diffusion region and monitoring the charge status using the probes.

5. The method of claim 1, wherein the test structure comprises a gate electrode, a diffusion region and interconnection leads couple with the gate electrode and diffusion region, the method further comprising placing probes on the interconnection leads and monitoring the charge status using the probes.

6. The method of claim 1, further comprising adjusting at least some parameters related to the processing step based on the monitored charge status.

7. The method of claim 1, further comprising forming the test structure, the test structure comprising a substrate, a gate electrode formed over the substrate, a trapping layer formed between the gate electrode and the substrate, and a diffusion region formed over the substrate besides the gate electrode.

8. The method of claim 7, further comprising determining that the charge status for the test structure is uniform when there is a shift in the CV curves.

9. The method of claim 7, further comprising detecting an edge charge effect based on a shift detected in the delayed inversion point information.

10. The method of claim 7, further comprising placing probes directly on the gate electrode and diffusion region and monitoring the charge status using the probes.

11. The method of claim 1 further comprising forming the plurality of test structures, each of the plurality of test structures comprising a substrate, a gate electrode formed over the substrate, a trapping layer formed between the gate electrode and the substrate, and a diffusion region formed over the substrate besides the gate electrode;

subjecting each of the plurality of the test structures to the semiconductor processing step;

performing a CV measurement on each of the plurality of test structures in order to generate a CV curve fro each of the plurality of test structures;

detecting whether there is a shift in at least one of the CV curves based on the measurements; and when there is not a shift in the CV curve for a particular one of the plurality of test structures, monitoring the charge status for the test structure based at least in part on delayed inversion point information.

12. The method of claim 11, further comprising determining that the charge status for at least one of the plurality of test structure is uniform when there is a shift in the CV curves for that test structure.

13. The method of claim 11, further comprising detecting an edge charge effect for at least one of the plurality of test structures based on a shift detected in the delayed inversion point information.

14. The method of claim 11, further comprising, for each of the plurality of test structures, placing probes directly on the gate electrode and diffusion region and monitoring the charge status using the probes.

* * * * *